United States Patent
Chang et al.

(10) Patent No.: US 8,427,132 B2
(45) Date of Patent: Apr. 23, 2013

(54) VOLTAGE DETECTION CIRCUIT AND METHOD THEREOF

(75) Inventors: Ya-Mei Chang, Tao Yuan County (TW); Yu-Pin Kao, Tainan (TW); Hung-Liang Liu, Tao Yuan County (TW); Cheng-Yang Tsai, Hsinchu County (TW)

(73) Assignee: Simplo Technology Co., Ltd, Hukou Township, Hsinchu County (TW)

( * ) Notice: Subject to any disclaimer, the term of this patent is extended or adjusted under 35 U.S.C. 154(b) by 389 days.

(21) Appl. No.: 12/862,288

(22) Filed: Aug. 24, 2010

(65) Prior Publication Data

US 2011/0234203 A1    Sep. 29, 2011

(30) Foreign Application Priority Data

Mar. 26, 2010 (TW) .............................. 99109175 A

(51) Int. Cl.
*G01R 19/00* (2006.01)
*H02J 7/04* (2006.01)
(52) U.S. Cl.
USPC .................. 324/76.11; 320/149; 320/162
(58) Field of Classification Search .................. None
See application file for complete search history.

(56) References Cited

U.S. PATENT DOCUMENTS

| 7,564,217 B2 * | 7/2009 | Tanigawa et al. | 320/118 |
| 7,893,656 B2 * | 2/2011 | Sobue | 320/134 |
| 2002/0075004 A1 | 6/2002 | Yudahira | |
| 2005/0110464 A1 * | 5/2005 | Baker | 320/134 |

FOREIGN PATENT DOCUMENTS

| JP | 2002139522 A | 5/2002 |
| JP | 2009099473 A | 5/2009 |
| TW | 502152 | 9/2002 |
| TW | I303720 | 12/2008 |
| TW | I304480 | 12/2008 |

* cited by examiner

*Primary Examiner* — Vinh Nguyen
(74) *Attorney, Agent, or Firm* — IPR Works, LLC

(57) ABSTRACT

A voltage detection circuit comprises a plurality of even-number voltage detection nodes, at least one odd-number voltage detection node, a voltage differential generation circuit, a selection circuit and a computing circuit. The selection circuit is for controlling the coupling relationship between the voltage differential generation circuit and the even and odd-number voltage detection nodes, so that the voltage differential generation circuit generates a voltage differential between the nodes. The computing circuit knows a voltage of a first even-number voltage detection node being as a reference voltage or obtains the voltage of the first even-number voltage detection node on the basis of the reference voltage, and respectively obtains a voltage of the nodes on the basis of the voltage differential between two adjacent nodes and the obtained voltage of a first even-number voltage detection node.

9 Claims, 5 Drawing Sheets

200
VOLTAGE DETECTION CIRCUIT AND METHOD THEREOF

BACKGROUND OF THE INVENTION

1. Field of the Invention

The present invention relates to a voltage detection circuit, especially to a voltage detection circuit for detecting the voltages of a plurality of battery cells in a battery pack.

2. Description of Related Art

Generally speaking, when recharging a rechargeable battery, a voltage detection circuit will be utilized to monitor the voltage of each of a plurality of battery cells in the rechargeable battery. When an abnormal condition is detected, the voltage detection circuit will stop the recharging procedure to protect the rechargeable battery from damage and thereby prolongs its usage life.

FIG. 1 shows a circuit diagram of a known voltage detection circuit. As shown in FIG. 1, a battery 10 includes a plurality of battery cells 11 connected in series. The voltage detection circuit 20 includes a plurality of subtraction circuit 21. Each subtraction circuit 21 includes a voltage divider 22, a reference voltage generation unit 23 and a subtraction unit 24 while each of the subtraction circuits 21 respectively connects to a positive electrode and a negative electrode of one of the battery cells 11 so as to detect the voltage of it.

However, the aforementioned voltage detection circuit will result in great detection errors due to the non-identical circuits and high costs due to the large amount of circuits.

SUMMARY OF THE INVENTION

In view of the aforementioned problems, the present invention provides a voltage detection circuit of less detection errors and lower costs.

According to an embodiment of the present invention, a voltage detection circuit comprises: a plurality of even-number voltage detection nodes, at least one odd-number voltage detection node, a voltage differential generation circuit, a selection circuit, and a computing circuit. The plurality of even-number voltage detection nodes includes a first even-number voltage detection node and a second even-number voltage detection node. The at least one odd-number voltage detection node includes a first odd-number voltage detection node. The selection circuit electrically connects to the voltage differential generation circuit, the plurality of even-number voltage generation nodes, and the at least one odd-number voltage generation node, so as to control their connection relation. Accordingly, the voltages of the first even-number and the first odd-number voltage detection nodes are output to the voltage differential generation circuit under the control of the selection circuit to generate a first voltage differential. Furthermore, the voltages of the first odd-number and the second even-number voltage detection nodes are output to the voltage differential generation circuit through the selection circuit to generate a second voltage differential. The computing circuit receives the first and second voltage differentials of the voltage differential generation circuit and calculates the voltage value of the first odd-number voltage detection node according to the first voltage differential and the voltage of the first even-number voltage detection node which is a reference voltage or derived from the reference voltage and known to the computing circuit. Afterward the computing circuit calculates the voltage value of the second even-number voltage detection node according to the second voltage differential and the calculated voltage value of the first odd-number voltage detection node.

According to an embodiment of the present invention, a voltage detection method comprises: controlling a connection relation between a voltage differential generation circuit and a plurality of voltage detection nodes including a plurality of even-number voltage detection nodes and at least one odd-number voltage detection node, so as to output the voltages of a first even-number, a first odd-number and a second even-number voltage detection nodes to the voltage differential generation circuit; utilizing the voltage differential generation circuit to generate a first voltage differential according to the voltages of the first even-number and first odd-number voltage detection nodes and a second voltage differential according to the voltages of the first odd-number and second even-number voltage detection nodes; outputting the first and second voltage differentials to a computing circuit; utilizing the computing circuit to calculate the voltage value of the first odd-number voltage detection node according to the first voltage differential and the voltage of the first even-number voltage detection node which is a reference voltage or derived from a reference voltage and thereby known to the computing circuit; utilizing the computing circuit to calculate the voltage value of the second even-number voltage detection node according to the second voltage differential and the calculated voltage value of the first odd-number voltage detection node.

Accordingly, by utilizing the selection circuit to output two voltages of the voltage detection nodes to the voltage differential generation circuit at a time, the voltage differential generation circuit can output corresponding voltage differentials to the computing circuit which thereby calculate each of the voltages between an even-number and an odd-number voltage detection nodes respectively. As a result, the amount of the voltage differential generation circuit of this invention is fewer than the subtraction circuits of the prior art, and the error and cost accompanied with the circuit amount can be reduced.

These and other objectives of the present invention will no doubt become obvious to those of ordinary skill in the art after reading the following detailed description of the preferred embodiment that is illustrated in the various figures and drawings.

DETAILED DESCRIPTION OF THE PREFERRED EMBODIMENTS

Figure 1:
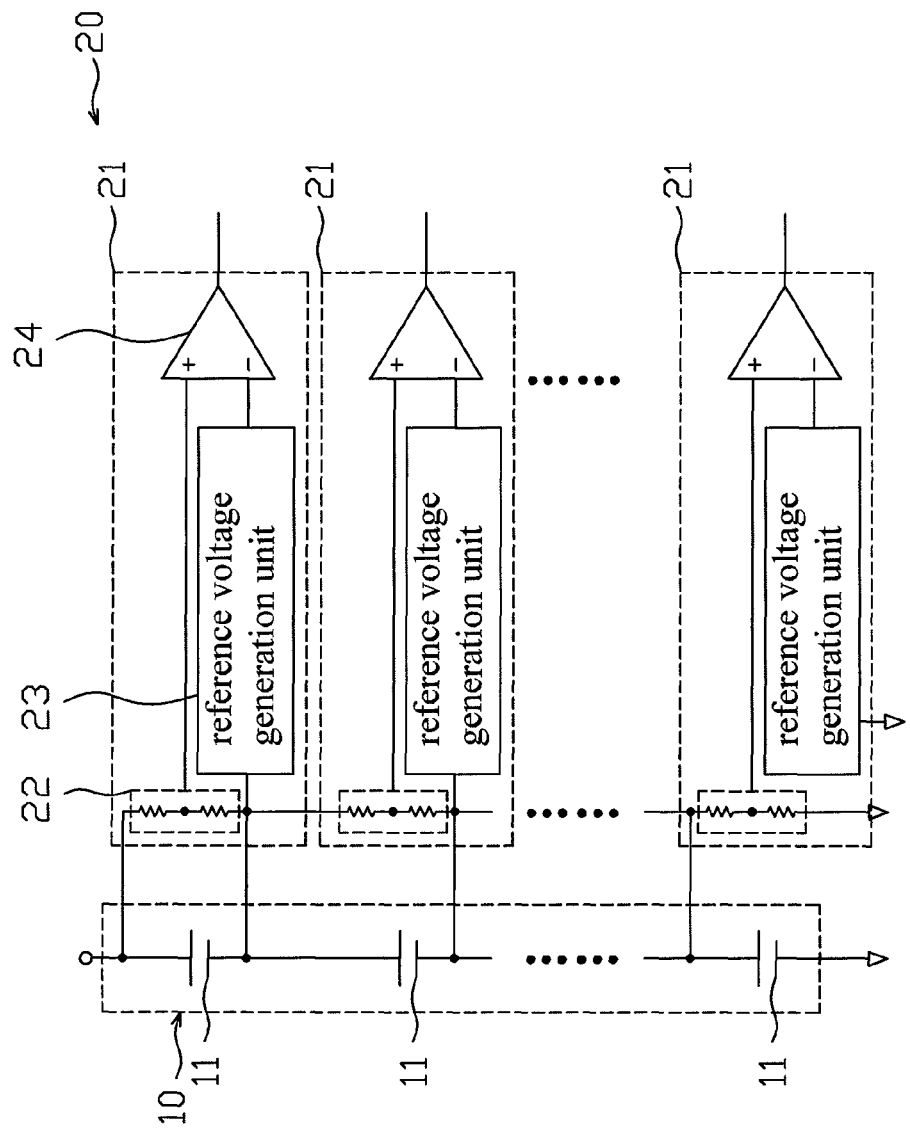
FIG. 1 shows a circuit diagram of the voltage detection circuit according to the prior art.
Figure 2:
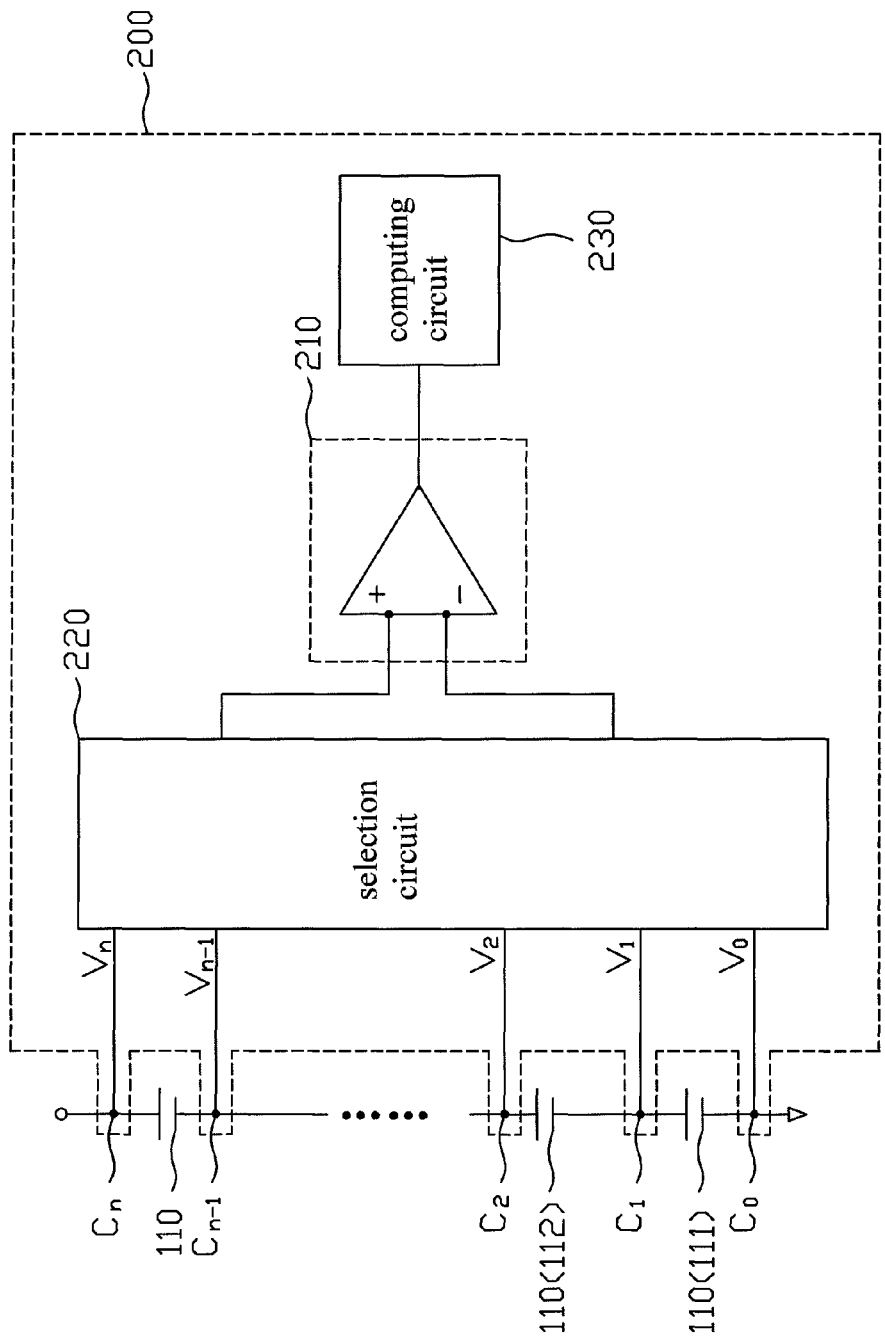
FIG. 2 shows a circuit diagram of the voltage detection circuit according to an embodiment of the present invention.

FIG. 2 shows a circuit diagram of the voltage detection circuit according to an embodiment of the present invention. As shown in FIG. 2, a voltage detection circuit 200 connects to a battery including a plurality of battery cells 110 which connect to each other in series and thereby form a plurality of connection nodes. The voltage detection circuit 200 can detect the voltages between two of the adjacent connection nodes and then calculate the voltage values $V_0 \sim V_n$ of the battery cells 110 in accordance with the detected voltages respectively. The voltage detection circuit 200 comprises a plurality of voltage detection nodes $C_0 \sim C_n$, a voltage differential generation circuit 210, a selection circuit 220 and a computing circuit 230. The voltage detection nodes $C_0 \sim C_n$ respectively couple to the connection nodes of the battery cells 110 and can be grouped into a plurality of even-number voltage detection nodes $C_0, C_2 \ldots, C_{n-1}$ and at least one odd-number voltage detection node $C_1 \ldots, C_n$. The plurality of even-number voltage detection nodes includes a first even-number voltage detection node $C_0$ and a second even-number voltage detection node $C_2$. The at least one odd-number voltage detection node includes a first odd-number voltage detection node $C_1$. Please note that in this embodiment, the suffix "n" denotes a positive odd integral. However, a person of ordinary skill in the art will appreciate that the suffix "n" may denote a positive even integral while the above-mentioned plurality of even-number voltage detection nodes will be $C_0$, $C_2 \ldots, C_n$ and the at least one odd-number voltage detection node will be $C_1 \ldots, C_{n-1}$. Please also note that the terms "odd-number" and "even-number" are used for distinguishing two different groups of the voltage detection nodes, not for the mathematic definitions.

The selection circuit 220 connects the voltage differential generation circuit 210 with the voltage detection nodes $C_0 \sim C_n$ including the plurality of even-number voltage detection nodes $C_0, C_2 \ldots$ and $C_{n-1}$ and the at least one odd-number voltage detection node $C_1, \ldots$ and $C_n$, so as to control the connection relation between them. For instance, the selection circuit 220 connects the voltage differential generation circuit 210 with the first even-number voltage detection node $C_0$ and the first odd-number voltage detection node $C_1$ at first, so as to allow the voltage differential generation circuit 210 generating a first voltage differential according to the voltage value $V_0$ of the first even-number voltage detection node $C_0$ and the voltage value $V_1$ of the first odd-number voltage detection node $C_1$, wherein the first voltage differential corresponds to the voltage differential between the positive and negative electrodes of a first battery cell 111 of the battery cells 110. Meanwhile, the selection circuit 220 connects the voltage differential generation circuit 210 with the first odd-number voltage detection node $C_1$ and the second even-number voltage detection node $C_2$, so as to allow the voltage differential generation circuit 210 generating a second voltage differential according to the voltage value $V_1$ of the first odd-number voltage detection node $C_1$ and the voltage value $V_2$ of the second even-number voltage detection node $C_2$, wherein the second voltage differential corresponds to the voltage differential between the positive and negative electrodes of a second battery cell 112 of the battery cells 110.

The computing circuit 230 couples to the voltage differential generation circuit 210 to receive the first and second voltage differentials. In this embodiment, the voltage value $V_0$, i.e. the voltage value of the first even-number voltage detection node $C_0$, is a reference voltage value or derived from the reference voltage value such that the computing circuit 230 knows or can derive it. Then the computing circuit 230 calculates the voltage value $V_1$ of the first odd-number voltage detection node $C_1$ in accordance with the first voltage differential, the voltage value $V_0$ of the first even-number voltage detection node $C_0$ and a predetermined calculation method. The computing circuit 230 further calculates the voltage value $V_2$ of the second even-number voltage detection node $C_2$ in accordance with the second voltage differential, the calculated voltage value $V_1$ of the first odd-number voltage detection node and the predetermined calculation method. Similarly, the voltage values of the voltage detection nodes $C_3 \sim C_n$ can be derived according to the above-described procedure. Please note that in this embodiment the first even-number voltage detection node is grounded such that its voltage value $V_0$ equals to ground voltage 0V, that is to say, the reference voltage value being 0V.

Figure 3:
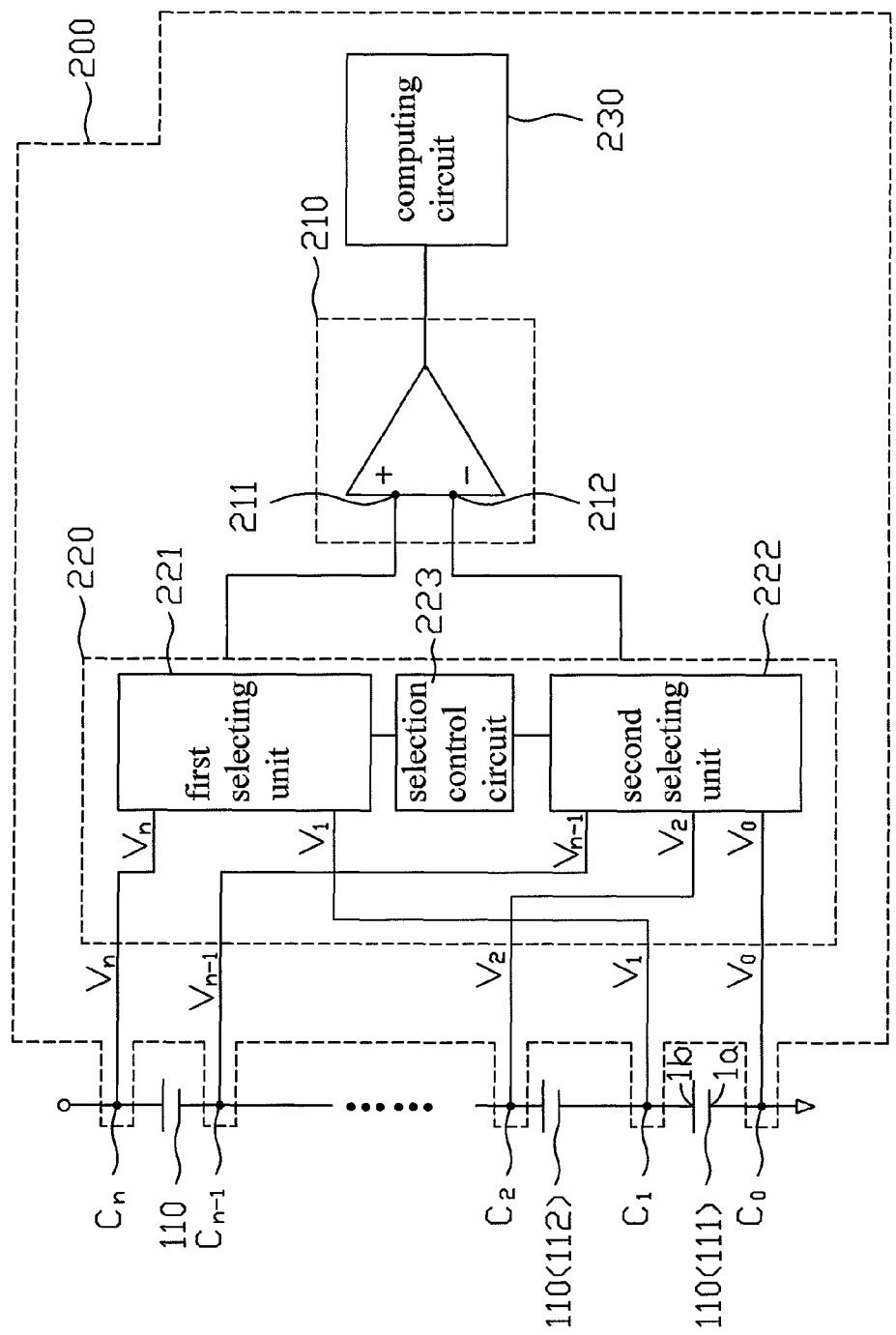
FIG. 3 shows a circuit diagram of the voltage detection circuit according to an embodiment of the present invention.

FIG. 3 shows a circuit diagram of the voltage detection circuit according to another embodiment of the present invention. As shown in FIG. 3, the voltage detection circuit 200 comprises a selection circuit 220 and a computing circuit 230 which is the same as that of FIG. 2. In this embodiment, the selection circuit 220 includes a first selecting unit 221, a second selecting unit 222 and a selection control circuit 223. Under the control of the selection control circuit 223, the first selecting unit 221 connects one of the odd-number voltage detection nodes $C_1, \ldots C_n$ to a first input end 211 of the voltage differential generation circuit 210, so as to output the voltage of the connected odd-number voltage detection node to the first input end 211 of the voltage differential generation circuit 210. The second selecting unit 222 connects one of the even-number voltage detection nodes $C_0, C_2, \ldots C_{n-1}$ to a second input end 212 of the voltage differential generation circuit 210 under the control of the selection control circuit 223, so as to output the voltage of the connected even-number voltage detection node to the second input end 212 of the voltage differential generation circuit 210. The selecting units 221 and 222 can be implemented by a multiplexer or a controllable switch network. Since the multiplexer and controllable switch network is well-know in this filed, superfluous words are thereby omitted.

More specifically, when a first battery cell 111 of the battery cells 110 is going to be detected, the first selecting unit 221 will connect the voltage detection node $C_1$ of the odd-number voltage detection nodes $C_1, \ldots C_n$ with a first electrode 1b (positive electrode) of the first battery cell 111 and then output a first voltage $V_1$ of the first electrode 1b (i.e. the voltage of the voltage detection node $C_1$) to the voltage differential generation circuit 210. The second selecting unit 222 will connect the voltage detection node $C_0$ of the even-number voltage detection nodes $C_0, C_2, \ldots C_{n-1}$ with a second electrode 1a (negative electrode) of the first battery cell 111 and then output a second voltage $V_0$ of the second electrode 1a (i.e. the voltage of the voltage detection node $C_0$) to the voltage differential generation circuit 210. Then the voltage differential generation circuit 210 detects and outputs the voltage differential between the two electrodes 1a, 1b of the first battery cell 111 according to the first voltage $V_1$ and the second voltage $V_0$. In this embodiment, the voltage differential generation circuit is an amplifier which multiplies the voltage difference between the first and second voltages $V_1$, $V_0$ with a gain factor to generate the voltage differential of the first battery cell 111. Please note that the gain factor is set to be 1 in this embodiment to simplify the description.

Furthermore, when a second battery cell 112 of the battery cells 110 is going to be detected, the first selecting unit 221 will connect the voltage detection node $C_1$ with a first electrode (negative electrode) of the second battery cell 112 and then output a first voltage $V_1$ of the first electrode (i.e. the voltage of the voltage detection node $C_1$) to the voltage differential generation circuit 210. The second selecting unit 222 will connect the voltage detection node $C_2$ with a second electrode (positive electrode) of the second battery cell 112 and then output a second voltage $V_2$ of the second electrode (i.e. the voltage of the voltage detection node $C_2$) to the voltage differential generation circuit 210. The voltage differential generation circuit 210 then detects and generates the voltage differential between the two electrodes of the second battery cell 112 according to the first voltage $V_1$ and the second voltage $V_2$. Similarly, when a $N_{th}$ battery cell N of the battery cells 110 is going to be detected, the first selecting unit 221 will connect the voltage detection node $C_n$ with a first electrode (positive electrode) of the $N_{th}$ battery cell N and then output a first voltage $V_n$ of the first electrode (i.e. the voltage of the voltage detection node $C_n$) to the voltage differential generation circuit 210. The second selecting unit 222 will connect the voltage detection node $C_{n-1}$ with a second electrode (negative electrode) of the $N_{th}$ battery cell N and then output a second voltage $V_{n-1}$ of the second electrode (i.e. the voltage of the voltage detection node $C_{n-1}$) to the voltage differential generation circuit 210. The voltage differential generation circuit 210 then detects and generates the voltage differential between the two electrodes of the $N_{th}$ battery cell N according to the first and second voltages $V_n$, $V_{n-1}$.

Figure 4:
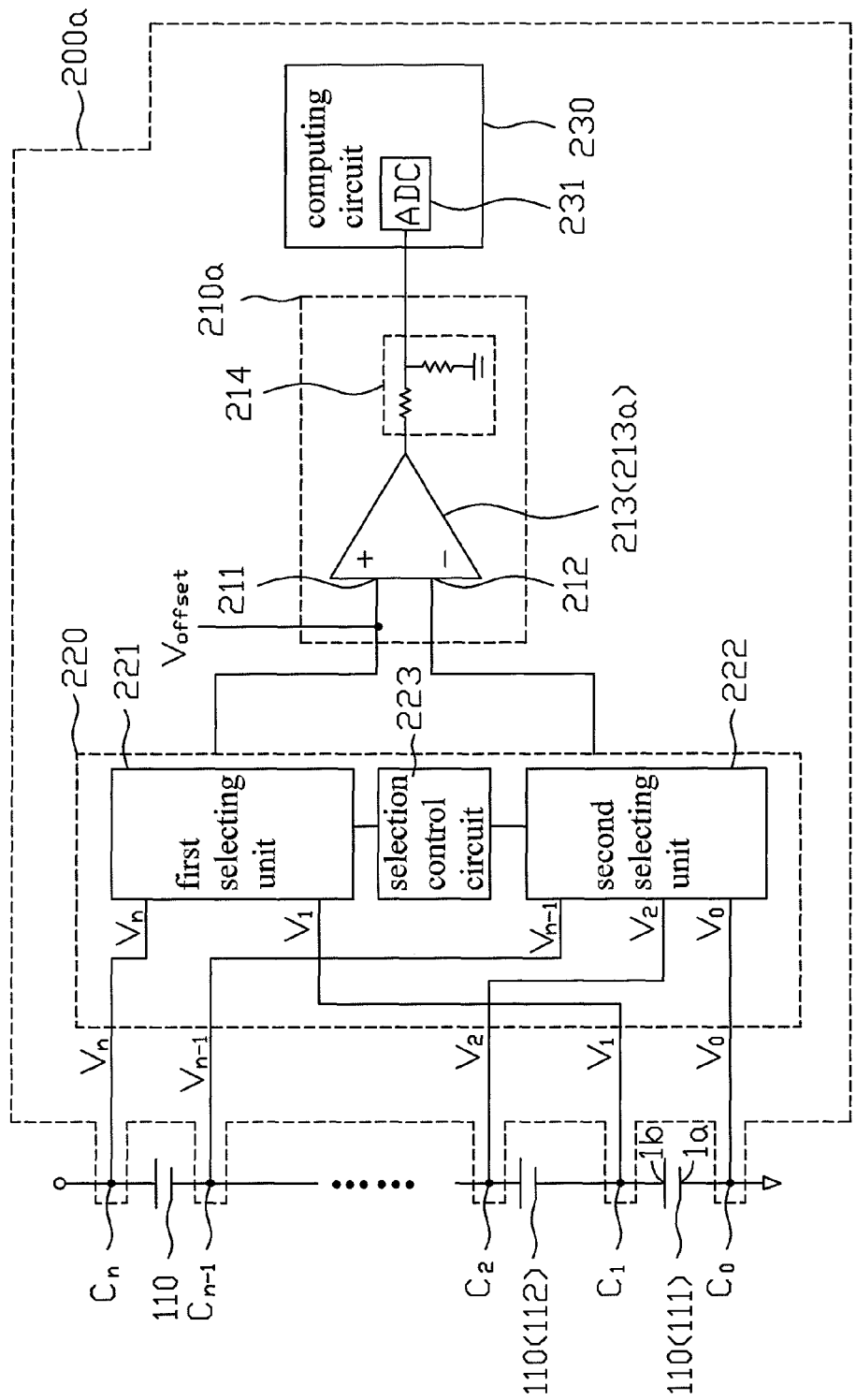
FIG. 4 shows a circuit diagram of the voltage detection circuit according to an embodiment of the present invention.

FIG. 4 shows a circuit diagram of the voltage detection circuit in accordance with an embodiment of the present invention. Because the voltage detection circuit 200a of this embodiment is similar to the voltage detection circuit 200 of the embodiment shown in FIG. 3, an identical label is used to denote the same element in FIGS. 3, 4 and reiterative descriptions are omitted. As shown in FIG. 4, the computing circuit 230 comprises an analog-to-digital converter (ADC) 231. The ADC 231 will convert the analog signal from the voltage differential generation circuit 210a into a digital signal such that the computing circuit 230 can process it.

Please refer to FIG. 4. The voltage differential generation circuit 210a comprises a subtraction unit 213 and a voltage divider 214 while an offset voltage $V_{offset}$ is inputted to the voltage differential generation circuit 210a so as to make sure it outputs a positive voltage differential to the computing circuit 230 (Please note that a person of ordinary skill in the art will appreciate how to modify the computing circuit 230 to deal with a "negative" voltage differential). In this embodiment, the subtraction unit 213 is an amplifier 213a having a first input end 211 (a positive input end) and a second input end 212 (a negative input end). Accordingly, the subtraction unit 213 (i.e. amplifier 213a) generates the voltage differentials corresponding to each of the battery cells 110 as following: $\Delta V_1 = V_{offset} + (V_1 - V_0)$ (corresponding to the battery voltage of the first battery cell 111); $\Delta V_2 = V_{offset} + (V_1 - V_2)$ (corresponding to the battery voltage of the second battery cell 112); $\Delta V_3 = V_{offset} + (V_3 - V_2)$ (corresponding to the battery voltage of a third voltage cell set next to the second battery cell 112); $\Delta V_4 = V_{offset} + (V_3 - V_4)$ (corresponding to the battery voltage of a fourth voltage cell set next to the third voltage cell); . . . ; and $\Delta V_n = V_{offset} + (V_n - V_{n-1})$ (corresponding to the battery voltage of the $N_{th}$ battery cell). Please note that all the voltage differentials $\Delta V_1$, $\Delta V_2$, $\Delta V_3$, $\Delta V_4$, . . . , and $\Delta V_n$ are positive due to the contribution from the offset voltage $V_{offset}$.

After receiving the voltage differentials from the subtraction unit 213, the voltage divider 214 generates proportioned voltage differentials appropriate for the computing circuit 230. To be more specific, the voltage divider 214 will output a proportioned voltage differential $k\Delta V$ when receiving an input voltage differential $\Delta V$, wherein the factor k is determined by the voltage processing capability of the computing circuit 230 and carried out by choosing proper resistors of the voltage divider 214 as shown in FIG. 4.

Please note that the fore-mentioned offset voltage $V_{offset}$ and/or voltage divider 214 can be omitted if the computing circuit 230 can handle voltages of different signs and/or has sufficient voltage processing capability. People of ordinary skill in the art can use any equivalent implementations to realize the present invention.

Please also note that one of the voltages of the voltage detection nodes $C_0$~$C_n$ is a reference voltage or a voltage derived from it. Consequently, the voltages of the other nodes can be derived from the reference voltage which is known to the computing circuit 230. For example, the first even-number voltage detection node $C_0$ is grounded and thereby its voltage $V_0$ is the reference voltage, i.e. 0V. Besides, since the factor k of the voltage divider 214 and the offset voltage $V_{offset}$ are predetermined or known to the computing circuit 230, the computing circuit 230 can derived the voltages of the voltage detection nodes $C_0$~$C_n$ from the following equations: $V_1 = (k\Delta V_1)/k - V_{offset} + V_0$, $V_2 = -(k\Delta V_2)/k + V_{offset} + V_1$, $V_3 = (k\Delta V_3)/k - V_{offset} + V_2$, $V_4 = -(k\Delta V_4)/k + V_{offset} + V_3$, . . . , and $V_n = (k\Delta V_n)/k - V_{offset} + V_{n-1}$.

To sum up, the aforementioned voltage detection circuit 200/200a utilizes the selection circuit 220 and the voltage differential generation circuit 210/210a to detect the voltage of each of the voltage detection nodes (i.e. the connection nodes of the battery cells 110) at different time such that the detection error is reduced due to the elimination of using a plurality of non-identical voltage differential generation circuits of the prior art.

Figure 5:
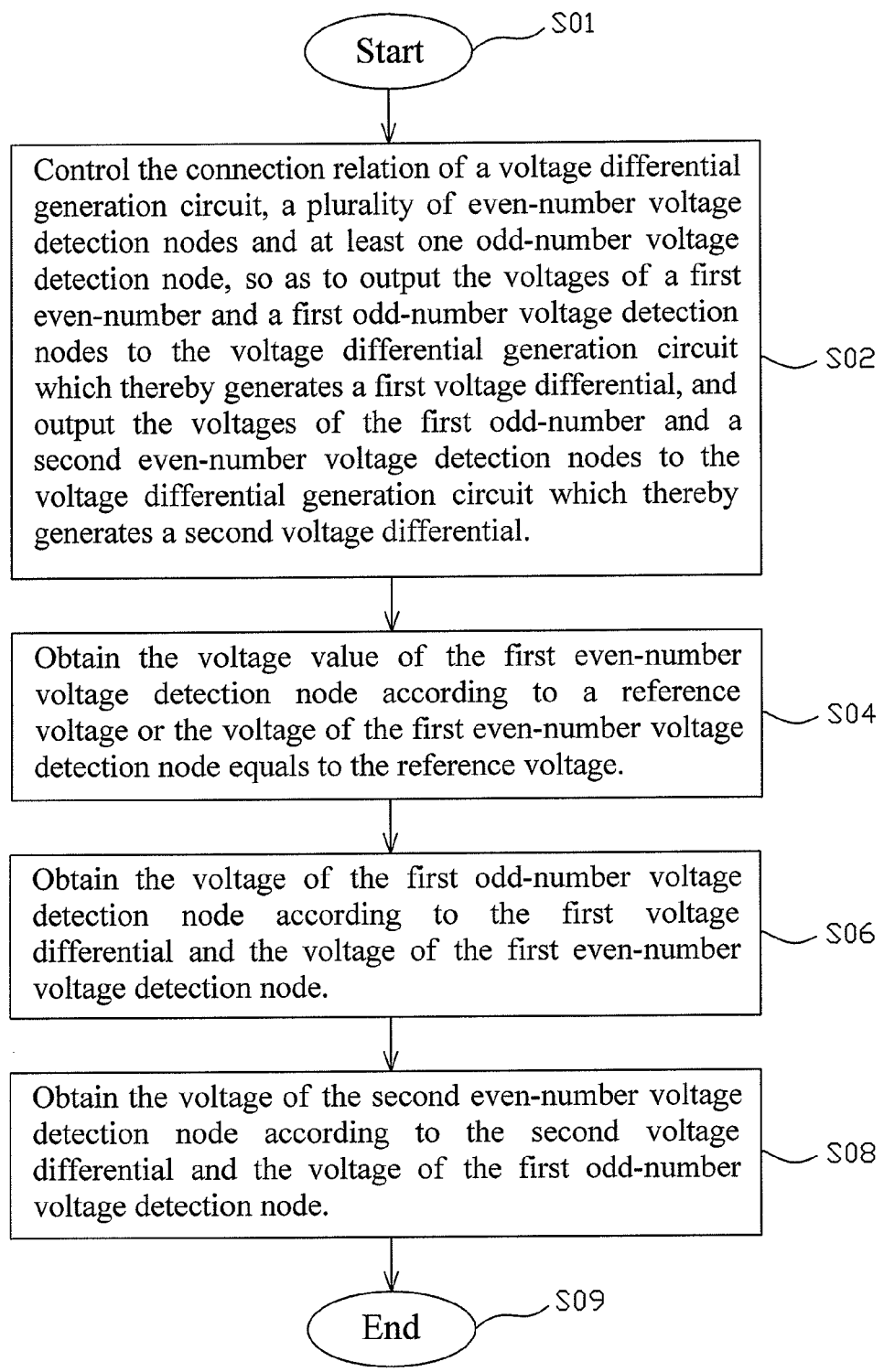
FIG. 5 shows a flow chart of the voltage detection method according to an embodiment of the present invention.

FIG. 5 shows a flow chart of the voltage detection method according to an embodiment of the present invention. As shown in FIG. 5, the voltage detection method includes the following steps.

Step S02: Control the connection relation of a voltage differential generation circuit, a plurality of even-number voltage detection nodes and at least one odd-number voltage detection node, so as to output the voltages of a first even-number and a first odd-number voltage detection nodes to the voltage differential generation circuit which thereby generates a first voltage differential, and output the voltages of the first odd-number and a second even-number voltage detection nodes to the voltage differential generation circuit which thereby generates a second voltage differential.

Step S04: Obtain the voltage value of the first even-number voltage detection node according to a reference voltage or the voltage of the first even-number voltage detection node equals to the reference voltage. In another embodiment, the step S04 further comprises receiving an offset voltage.

Step S06: Obtain the voltage of the first odd-number voltage detection node according to the first voltage differential and the voltage of the first even-number voltage detection node, the voltage of the first odd-number voltage detection node being equal to the sum of the first voltage differential and the voltage of the first even-number voltage detection node in this embodiment (i.e. $V_1 = \Delta V_1 + V_0$). In the embodiment of utilizing the offset voltage, the step S06 further comprises subtracting the offset voltage from the sum to obtain the voltage of the first odd-number voltage detection node (i.e. $V_1 = \Delta V_1 + V_0 - V_{offset}$).

Step S08: Obtain the voltage of the second even-number voltage detection node according to the second voltage differential and the voltage of the first odd-number voltage detection node, the voltage of the second even-number voltage detection node being equal to the result of subtracting the second voltage differential from the voltage of the first odd-number voltage detection node in this embodiment (i.e. $V_2 = V_1 - \Delta V_2$). In the embodiment of utilizing the offset voltage, the step S08 further comprises adding the offset voltage to the result to obtain the voltage of the second even-number voltage detection node (i.e. $V_2 = V_1 - \Delta V_2 + V_{offset}$).

Finally, please note that the aforementioned descriptions represent merely the preferred embodiment of the present invention, without any intention to limit the scope of the present invention thereto. Various equivalent changes, alterations, or modifications based on the claims of present invention are all consequently viewed as being embraced by the scope of the present invention.

What is claimed is:

1. A voltage detection circuit, comprising:
a plurality of even-number voltage detection nodes including a first even-number voltage detection node and a second even-number voltage detection node;
at least an odd-number voltage detection node including a first odd-number voltage detection node;
a voltage differential generation circuit;
a selection circuit controlling the connection relation of the voltage differential generation circuit, the plurality of even-number voltage detection nodes and the at least one odd-number voltage detection node, so as to output the voltages of the first even-number and first odd-number voltage detection nodes to the voltage differential generation circuit which thereby generates a first voltage differential and output the voltages of the first odd-number and second even-number voltage detection nodes to the voltage differential generation circuit which thereby generates a second voltage differential; and
a computing circuit receiving the first and second voltage differentials while the voltage of the first even-number voltage detection node is a reference voltage or derived from the reference voltage and thereby known to the computing circuit, the computing circuit obtaining the voltage of the first odd-number voltage detection node according to the first voltage differential and the voltage of the first even-number voltage detection node and obtaining the voltage of the second even-number voltage detection node according to the second voltage differential and the voltage of the first odd-number voltage detection node,
wherein the voltage differential generation circuit further receives an offset voltage to make sure that the first and second voltage differentials are with the same signs.

2. The voltage detection circuit of claim 1, wherein the selection circuit comprises:
a first selecting unit connecting to the plurality of even-number voltage detection nodes;
a second selecting unit connecting to the at least one odd-number voltage detection node; and
a selection control circuit controlling the first and second selecting units to manage a first connection relation between the voltage differential generation circuit and the plurality of the even-number voltage detection nodes and a second connection relation between the voltage differential generation circuit and the at least one odd-number voltage detection node.

3. The voltage detection circuit of claim 1, wherein the voltage differential generation circuit comprises:
a subtraction unit generating a first voltage according to the voltages of the first even-number and first odd-number voltage detection nodes, and generating a second voltage according to the voltages of the first odd-number and second even-number voltage detection nodes; and
a voltage divider outputting the first and second voltage differentials to the computing circuit in accordance with the first and second voltages respectively.

4. The voltage detection circuit of claim 1, wherein the computing circuit obtains the voltage of the first odd-number voltage detection node according to the result of subtracting the offset voltage from the sum of the first voltage differential and the voltage of the first even-number voltage detection node, and obtains the voltage of the second even-number voltage detection node according to the result of subtracting the second voltage differential from the sum of the offset voltage and the voltage of the first odd-number voltage detection node.

5. The voltage detection circuit of claim 1, wherein the computing circuit obtains the voltage of the first odd-number voltage detection node according to the result of adding the first voltage differential to the voltage of the first even-number voltage detection node, and obtains the voltage of the second even-number voltage detection node according to the result of subtracting the second voltage differential from the voltage of the first odd-number voltage detection node.

6. A voltage detection method, comprising:
utilizing a selection circuit to manage a first connection relation between a voltage differential generation circuit and a plurality of even-number voltage detection nodes including a first even-number voltage detection node and a second even-number voltage detection node, and manage a second connection relation between the voltage differential generation circuit and at least one odd-number voltage detection node including a first odd-number voltage detection node;
under the control of the selection circuit, outputting the voltages of the first even-number and first odd-number voltage detection nodes to the voltage differential generation circuit which thereby generates a first voltage differential;
under the control of the selection circuit, outputting the voltages of the first odd-number and second even-number voltage detection nodes to the voltage differential generation circuit which thereby generates a second voltage differential;
utilizing a computing circuit to receive the first and second voltage differentials while the voltage of the first even-number voltage detection node is a reference voltage or derived from the reference voltage and thereby known to the computing circuit;
utilizing the computing circuit to obtain the voltage of the first odd-number voltage detection node according to the first voltage differential and the voltage of the first even-number voltage detection node; and
utilizing the computing circuit to obtain the voltage of the second even-number voltage detection node according to the second voltage differential and the voltage of the first odd-number voltage detection node.

7. The voltage detection method of claim 6, wherein the voltage of the first odd-number voltage detection node is obtained according to the result of adding the first voltage differential to the voltage of the first even-number voltage detection node, and the voltage of the second even-number voltage detection node is obtained according to the result of subtracting the second voltage differential from the voltage of the first odd-number voltage detection node.

8. The voltage detection method of claim 6, further comprising:
providing an offset voltage to make sure that the first and second voltage differentials are with the same signs.

9. The voltage detection method of claim 8, wherein the voltage of the first odd-number voltage detection node is obtained according to the result of subtracting the offset voltage from the sum of the first voltage differential and the voltage of the first even-number voltage detection node, and the voltage of the second even-number voltage detection node is obtained according to the result of subtracting the second voltage differential from the sum of the offset voltage and the voltage of the first odd-number voltage detection node.

* * * * *